United States Patent
Wu et al.

(10) Patent No.: US 11,616,140 B2
(45) Date of Patent: Mar. 28, 2023

(54) VERTICAL TRANSPORT FIELD EFFECT TRANSISTOR WITH BOTTOM SOURCE/DRAIN

(71) Applicant: International Business Machines Corporation, Armonk, NY (US)

(72) Inventors: Heng Wu, Guilderland, NY (US); Gen Tsutsui, Glenmont, NY (US); Lan Yu, Voorheesville, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/225,327

(22) Filed: Apr. 8, 2021

(65) Prior Publication Data

US 2021/0226055 A1    Jul. 22, 2021

Related U.S. Application Data

(62) Division of application No. 16/590,813, filed on Oct. 2, 2019, now Pat. No. 11,056,588.

(51) Int. Cl.
| | | |
|---|---|---|
| *H01L 29/78* | (2006.01) | |
| *H01L 29/66* | (2006.01) | |
| *H01L 21/8234* | (2006.01) | |
| *H01L 27/088* | (2006.01) | |

(52) U.S. Cl.
CPC ............ *H01L 29/7827* (2013.01); *H01L 21/823418* (2013.01); *H01L 21/823487* (2013.01); *H01L 27/088* (2013.01); *H01L 29/66666* (2013.01)

(58) Field of Classification Search
CPC combination set(s) only.
See application file for complete search history.

(56) References Cited

U.S. PATENT DOCUMENTS

| | | | |
|---|---|---|---|
| 9,647,120 | B1 | 5/2017 | Bi et al. |
| 9,647,123 | B1 | 5/2017 | Balakrishnan et al. |
| 9,721,845 | B1 | 8/2017 | Cheng et al. |
| 9,755,073 | B1 | 9/2017 | Cheng et al. |
| 9,761,728 | B1 | 9/2017 | Cheng et al. |
| 9,793,401 | B1 | 10/2017 | Balakrishnan et al. |
| 9,799,765 | B1 | 10/2017 | Bergendahl et al. |
| 9,805,935 | B2 | 10/2017 | Anderson et al. |
| 9,960,272 | B1 | 5/2018 | Bao et al. |
| 9,997,418 | B2 | 6/2018 | Pranatharthiharan et al. |
| 10,157,794 | B1 | 12/2018 | Suvarna et al. |
| 10,170,588 | B1 | 1/2019 | Yamashita et al. |
| 2015/0340465 | A1* | 11/2015 | Harley ............... H01L 21/3086 438/299 |

(Continued)

OTHER PUBLICATIONS

List of IBM Patents or Patent Applications Treated as Related.

*Primary Examiner* — Moin M Rahman
*Assistant Examiner* — Mohammad A Rahman
(74) *Attorney, Agent, or Firm* — Robert Sullivan; Ryan, Mason & Lewis, LLP

(57) ABSTRACT

A vertical field effect transistor structure having at least two vertically oriented fins extending from a substrate. The vertical field effect transistor structure further includes a first source/drain region disposed in the substrate between the two vertically oriented fins and under each of the fins. The outer ends of the first source/drain region are in contact with outer ends of the fins. A portion of the first source/drain region extends beyond the fins.

20 Claims, 10 Drawing Sheets

(56) References Cited

U.S. PATENT DOCUMENTS

| | | |
|---|---|---|
| 2016/0149036 A1 | 5/2016 | Huang et al. |
| 2018/0040716 A1* | 2/2018 | Cheng .................... H01L 29/49 |
| 2018/0069097 A1* | 3/2018 | Cheng ............... H01L 21/31111 |
| 2021/0098627 A1* | 4/2021 | Liaw ................. H01L 29/66545 |

* cited by examiner

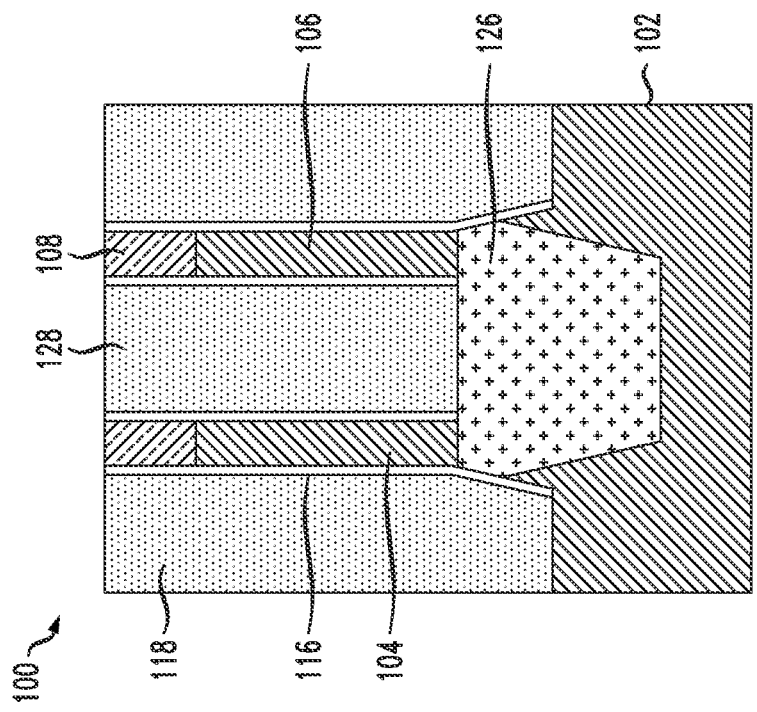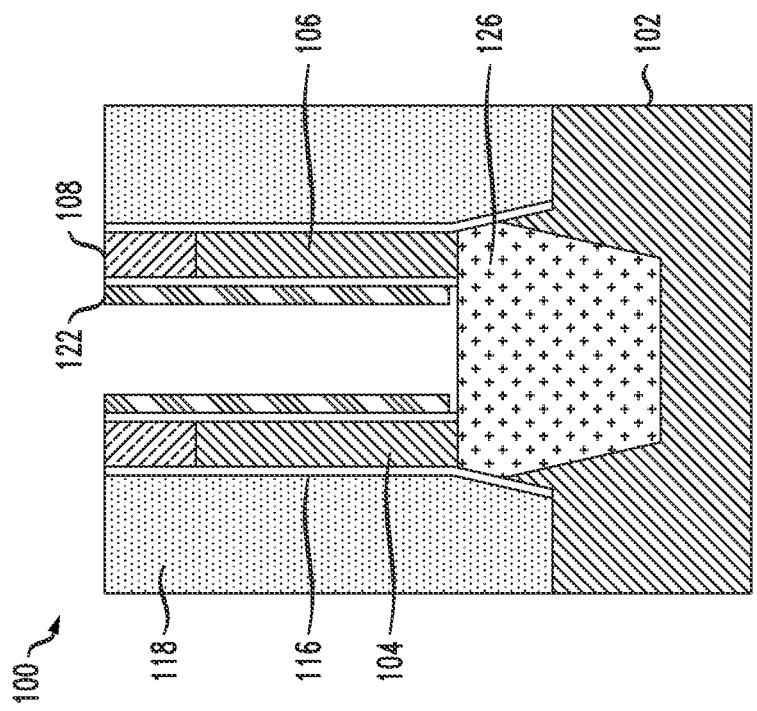

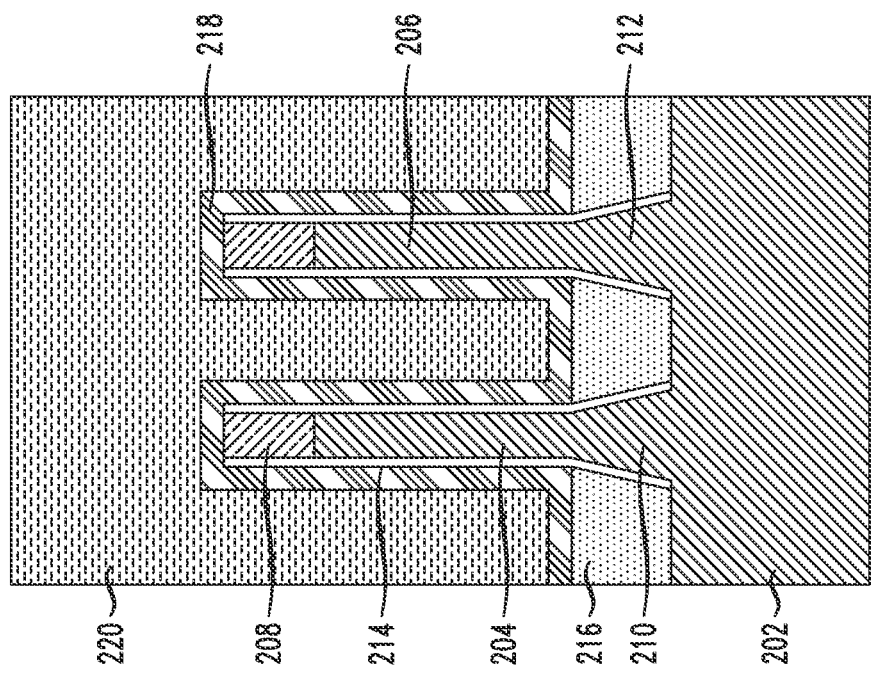
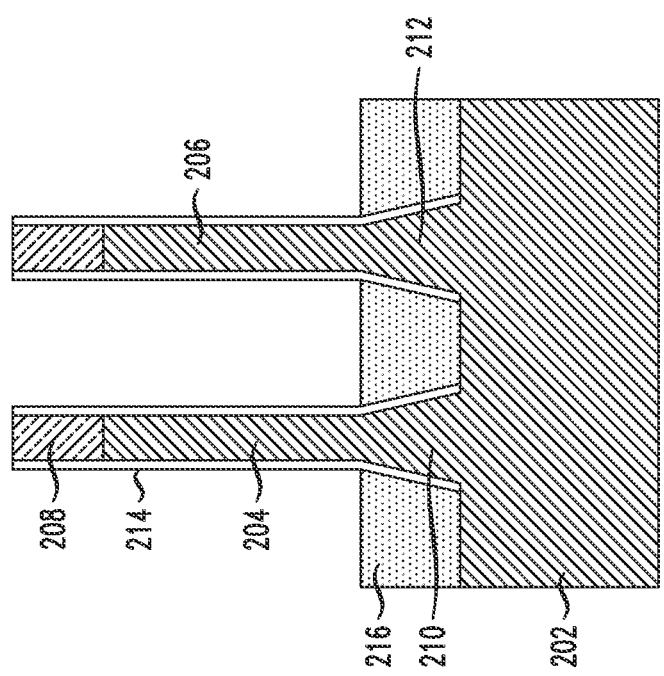

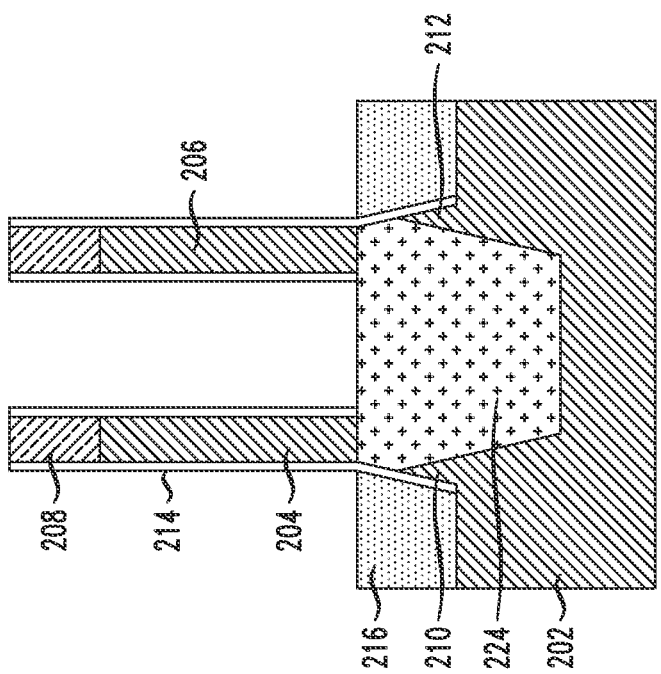
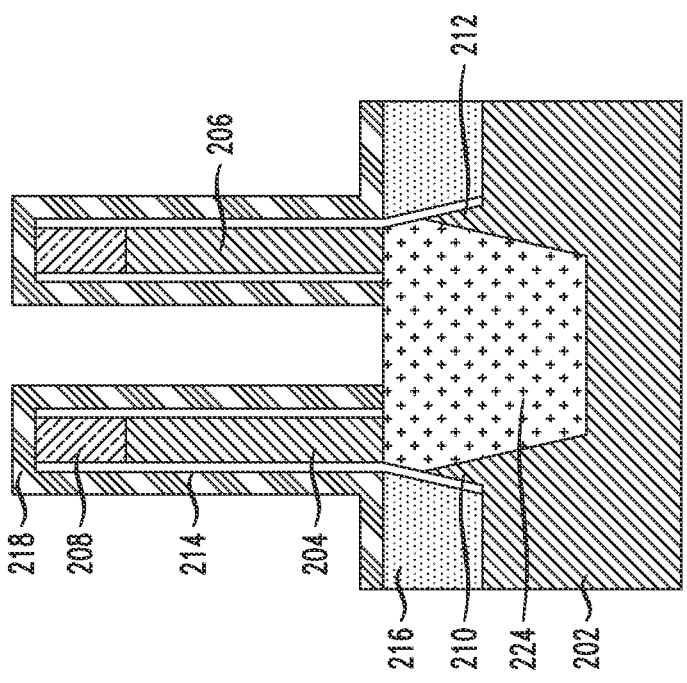

VERTICAL TRANSPORT FIELD EFFECT TRANSISTOR WITH BOTTOM SOURCE/DRAIN

BACKGROUND

Vertical transport field effect transistors (VFETs) are becoming viable device options for semiconductor devices beyond the so-called "seven nanometer (7 nm) node." VFET devices include fin channels with source/drain regions at ends of the fin channels, i.e., on tops and bottoms of the fins. Current flows through the fin channels in a vertical direction (e.g., perpendicular to a substrate), for example, from a bottom source/drain region to a top source/drain region. VFET devices are designed to address the limitations of horizontal device architectures, for example, by decoupling gate length from the contact gate pitch, providing a FinFET-equivalent density at a larger contacted poly pitch (CPP), and providing lower middle-of-the-line (MOL) resistance.

SUMMARY

According to an exemplary embodiment of the present invention, a method for manufacturing a vertical transistor device comprises forming a plurality of fins on a substrate. The method further comprises forming an interlevel dielectric layer on the substrate and sidewalls of each of the fins. The method further comprises selectively removing the interlevel dielectric layer between adjacent fins. The method further comprises laterally recessing a portion of the substrate between the adjacent fins to form a bottom source/drain cavity exposing a bottom portion of each fin and extending beyond each fin. The method further comprises epitaxially growing an epitaxial growth material from the substrate and filling the bottom source/drain cavity.

According to an exemplary embodiment of the present invention, a vertical transistor device comprises a substrate. The vertical transistor device further comprises a bottom source/drain region in at least a portion of the substrate and under adjacent fins; wherein the bottom source/drain region extends beyond the fins. The vertical transistor device further comprises a gate structure in contact with the adjacent fins. The vertical transistor device further comprises a top source/drain region disposed on the gate structure.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which:

FIG. 7 is a cross-sectional view of the semiconductor structure at a seventh-intermediate fabrication stage, according to an illustrative embodiment.

FIG. 8 is a cross-sectional view of the semiconductor structure at an eighth-intermediate fabrication stage, according to an illustrative embodiment.

FIG. 11 is a cross-sectional view of the semiconductor structure at a second-intermediate fabrication stage, according to an illustrative alternative embodiment.

FIG. 12 is a cross-sectional view of the semiconductor structure at a third-intermediate fabrication stage, according to an illustrative alternative embodiment.

FIG. 17 is a cross-sectional view of the semiconductor structure at an eighth-intermediate fabrication stage, according to an illustrative alternative embodiment.

FIG. 18 is a cross-sectional view of the semiconductor structure at a ninth-intermediate fabrication stage, according to an illustrative alternative embodiment.

DETAILED DESCRIPTION

Figure 2:
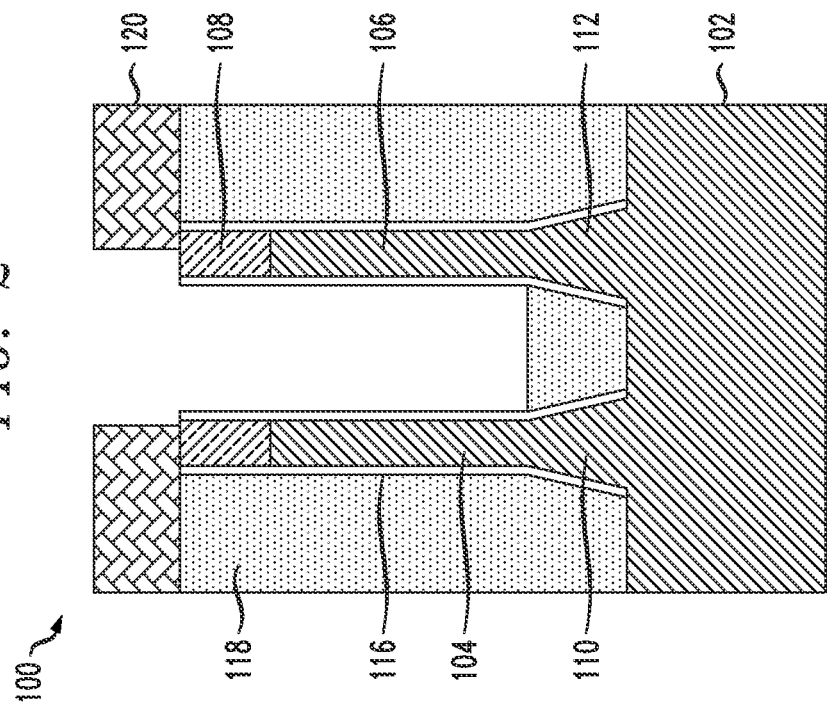
FIG. 2 is a cross-sectional view of the semiconductor structure at a second-intermediate fabrication stage, according to an illustrative embodiment.

This disclosure relates generally to transistors, and more particularly to vertical fin-shaped field effect transistors and methods for their fabrication.

Exemplary embodiments of the invention will now be discussed in further detail with regard to semiconductor devices and methods of manufacturing same and, in particular, to VFET devices including a bottom source/drain (S/D) epitaxial layer.

VFETs are a promising option for technology scaling for 5 nm and beyond. However, during fabrication of these transistors it is difficult to form an aligned bottom junction since there is no guarantee that etching of the fins stops at the edge of the highly doped source/drain layer. For example, the current VFET bottom source/drain epitaxial region does not fully cover the fin end. In addition, the current bottom source/drain region of VFETs requires a high temperature to drive in the dopant, leading to a poor junction gradient and a poor bottom junction resistance. Accordingly, embodiments of the present invention correspond to VFETs with a bottom source/drain that can be obtained such that a bottom source/drain epitaxial can be grown underneath the fin, thereby improving the bottom junction gradient and resistance.

It is to be understood that the various layers and/or regions shown in the accompanying drawings are not drawn to scale, and that one or more layers and/or regions of a type commonly used in, for example, FinFET, VFET, complementary metal-oxide-semiconductor (CMOS), field-effect transistor (FET), nanowire FET, nanosheet FETs, metal-oxide-semiconductor field-effect transistor (MOSFET), single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FinFETs, VFETs, CMOSs, FETs, nanowire FETs, nanosheet FETs, SETs, and/or MOSFETs. By way of non-limiting example, the semiconductor devices can include, but are not necessarily limited to FinFET, VFET, CMOS, FET, nanowire FET, nanosheet FET, SET, CMOS and MOSFET devices, and/or semiconductor devices that use FinFET, VFET, CMOS, FET, nanowire FET, nanosheet FET, SET, CMOS and/or MOSFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

Referring now to the drawings in which like numerals represent the same of similar elements, FIGS. 1-19 illustrate various processes for fabricating VFETs with a bottom source/drain epitaxy. Note that the same reference numeral (100) is used to denote the semiconductor structure through the various intermediate fabrication stages illustrated in FIGS. 1 through 9. Note also that the semiconductor structure described herein can also be considered to be a semiconductor device and/or an integrated circuit, or some part thereof. For the purpose of clarity, some fabrication steps leading up to the production of the semiconductor structure as illustrated in FIGS. 1-19 are omitted. In other words, one or more well-known processing steps which are not illustrated but are well-known to those of ordinary skill in the art have not been included in the figures.

Figure 1:
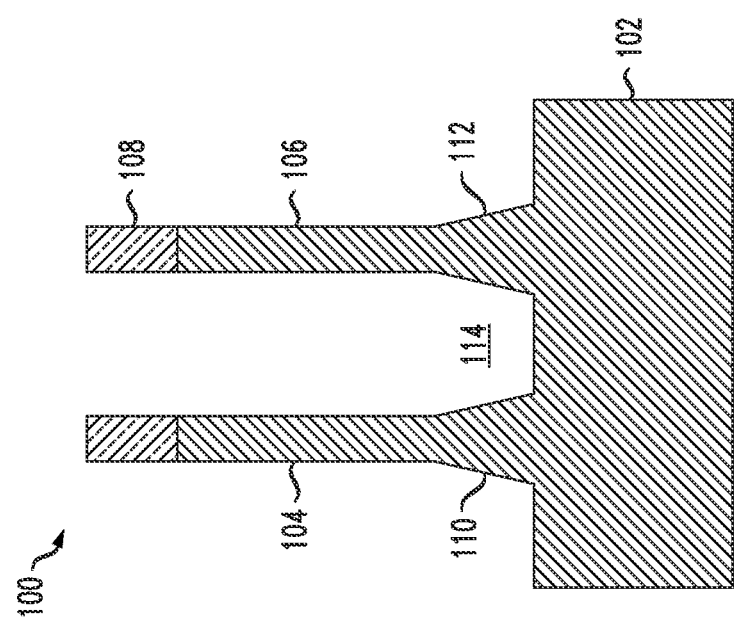
FIG. 1 is a cross sectional view of a semiconductor structure at a first-intermediate fabrication stage, according to an illustrative embodiment.

FIGS. 1-9 illustrate one embodiment of the present invention. FIG. 1 is a cross sectional view of a semiconductor structure at a first-intermediate fabrication stage. FIG. 1 shows a partial semiconductor structure/device 100 including a semiconductor substrate 102, fins 104 and 106, and a hardmask layer 108. Semiconductor substrate 102 can be a semiconductor material including, for example, silicon (Si), silicon germanium (SiGe) at various Si and Ge concentrations, silicon carbide (SiC), Si:C (carbon doped silicon), silicon germanium carbide (SiGeC), carbon doped silicon germanium (SiGe:C), compound semiconductor materials (e.g. Groups III-V), or other like semiconductor material. In addition, multiple layers of the semiconductor materials can be used as the semiconductor material of the substrate. Semiconductor substrate 102 can be a bulk substrate or a semiconductor-on-insulator substrate such as, but not limited to, a silicon-on-insulator (SOI), silicon-germanium-on-insulator (SGOI) or Groups III-V-on-insulator substrate including a buried insulating layer, such as, for example, a buried oxide, nitride layer or aluminum oxide.

Fins, such as fins 104 and 106, may be formed by any technique known in the art. For example, a hardmask layer 108 may be deposited on the surface of semiconductor substrate 102 to preferably act as an etch stop layer that can be used, as needed, throughout the vertical fin fabrication process. Next, a photoresist layer (not shown) may be provided above hardmask layer 108. In at least one embodiment of the present invention, hardmask layer 108 can be patterned or etched by any technique known in the art. For example, etching may be accomplished by patterning and/or etching using a conventional image transfer (CIT) or a sidewall image transfer (SIT) to generate any pattern or patterns of narrow and/or broad lines on a photoresist layer (not shown) as desired. Other techniques or processes may also be used in order to provide greater design flexibility with respect to forming narrow and/or broad vertical fins. While embodiments of the present invention describe channel regions as fins, the embodiments are not necessarily limited to fin channel regions, and may include nanowire channel regions. In addition, although four fins are shown in the figures for ease of explanation, more or less than four fins can be formed.

In one embodiment, a directional etching process such as, for example, a reactive-ion-etching (RIE) process, is carried out. The etching results in pillar structures 110 and 112 being formed from the substrate 102. In one embodiment, a bottom portion of each pillar structure is wider than a top portion of each pillar structure and the fin structure itself, i.e., wherein each pillar of the plurality of pillars is formed with a tapered configuration. The etching also results in a well/cavity 114 being formed between each pillar structure 110 and 112 and below the fin structures 104 and 106. In one embodiment, the fins have a thickness of, for example, about 20 nm to about 100 nm. After the RIE etching process, the photoresist mask used in the lithographic etching process can be removed.

FIG. 2 is a cross-sectional view illustrating the semiconductor structure 100 at a second intermediate stage of fabrication according to an exemplary embodiment. During this stage, a liner layer 116 is deposited on the exterior surfaces of fins 104 and 106 and pillars 110 and 112. The liner layer 116 can be deposited using deposition techniques including, but not limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering. Suitable material for liner layer 116 includes, for example, SiN, SiCN, and SiCO.

Next, an interlevel dielectric (ILD) layer 118 is deposited on substrate 102 and on liner layer 116. The ILD layer 118 includes, for example, any suitable dielectric material such as silicon oxide, silicon nitride, hydrogenated silicon carbon oxide, silicon based low-k dielectrics, flowable oxides, porous dielectrics, or organic dielectrics including porous organic dielectrics. Non-limiting examples of suitable low-k dielectric materials include a spin-on-glass, a flowable oxide, a high density plasma oxide, borophosphosilicate glass (BPSG), or any combination thereof. In one embodiment, ILD layer 118 is a shallow trench isolation (STI) oxide layer. ILD layer 118 may be formed using any suitable deposition techniques including CVD, ALD, PVD, PECVD, chemical solution deposition or other like processes. ILD layer 118 is then planarized by, for example, a planarization process such as a chemical mechanical planarization (CMP).

Next, ILD layer 118, liner layer 116 and hardmask layer 108 are patterned using etch stop layer 120 to selectively remove a portion of ILD layer 118 between adjacent fins 104 and 106. ILD layer 118 is selectively removed using, for example, RIE, leaving ILD layer 118 in well/cavity 114 formed between each pillar structure 110 and 112 and below the fin structures 104 and 106.

Figure 3:
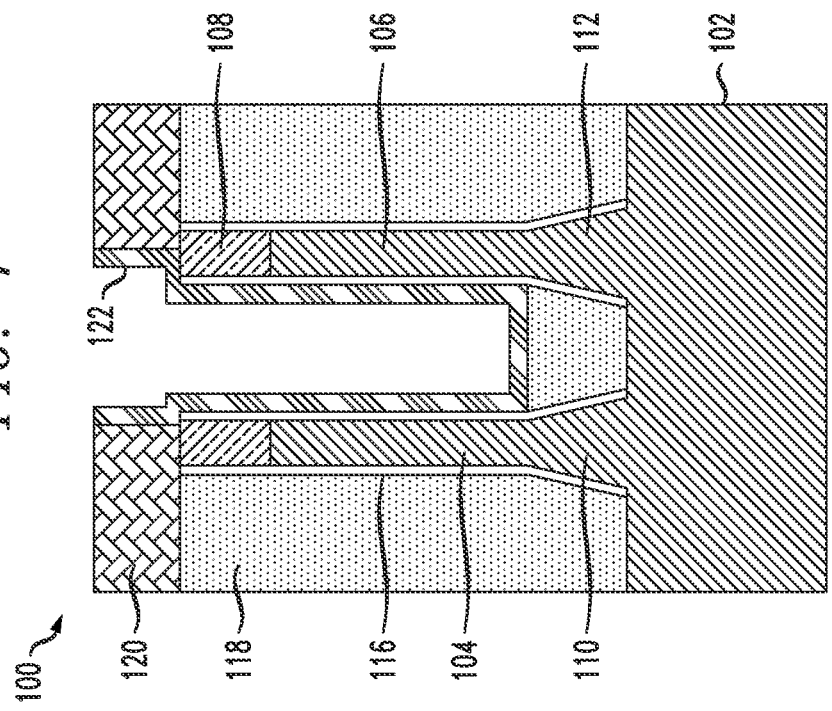
FIG. 3 is a cross-sectional view of the semiconductor structure at a third-intermediate fabrication stage, according to an illustrative embodiment.
Figure 4:
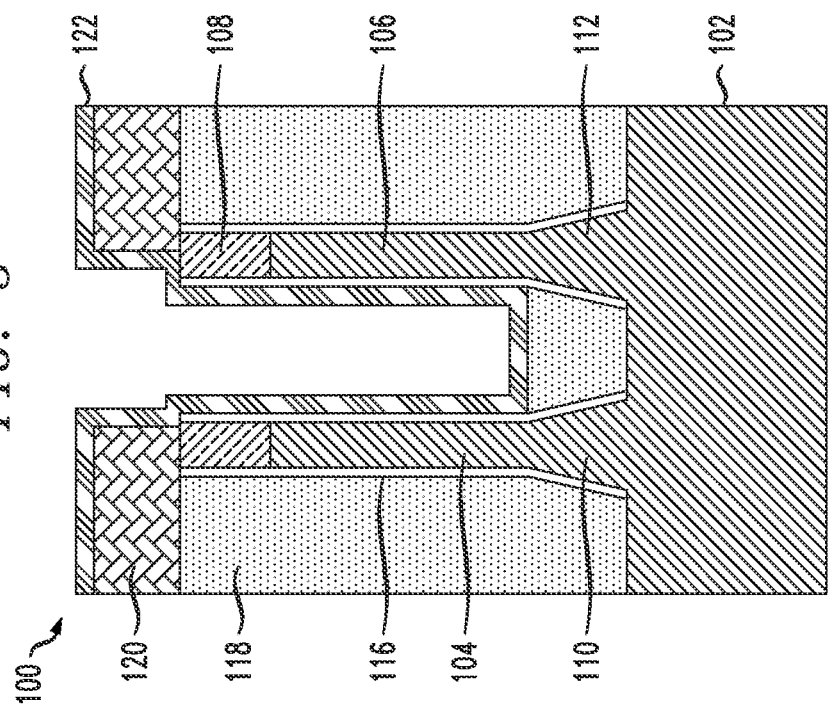
FIG. 4 is a cross-sectional view of the semiconductor structure at a fourth-intermediate fabrication stage, according to an illustrative embodiment.

FIGS. 3 and 4 are cross-sectional views illustrating the semiconductor structure 100 at a third and fourth intermediate stage of fabrication according to an exemplary embodiment. Referring to FIG. 3, sidewall liner 122 is formed on liner layer 116 and over ILD layer 118, and etch stop layer 120. Sidewall liner 122 may be formed by conformally depositing a layer of liner material and performing a directional RIE to remove the horizontal portions (see FIG. 4) relative to top surface of substrate 102 of the layer of liner material. Suitable materials for sidewall liner 122 include, for example, $SiO_2$, TiOx, SiN, and SiCN.

Figure 5:
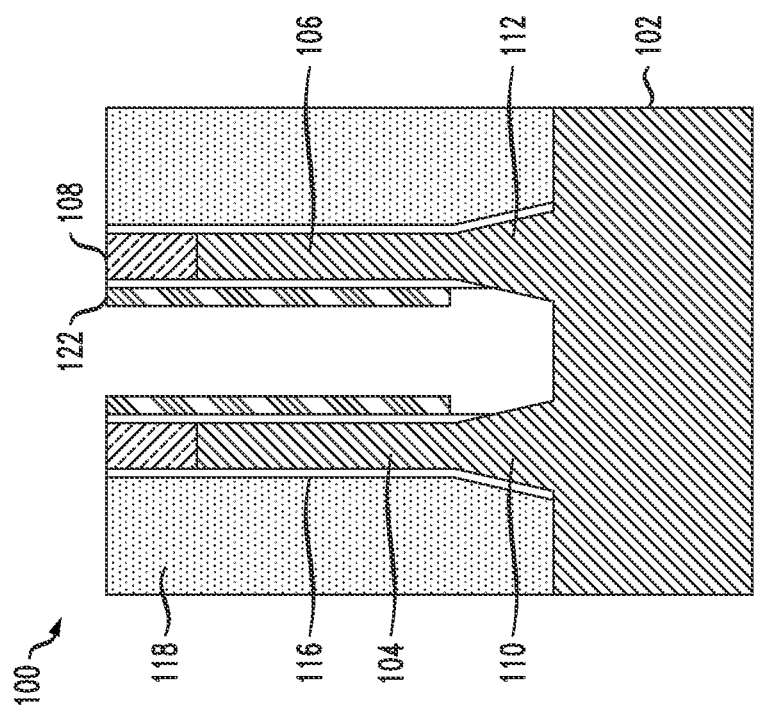
FIG. 5 is a cross-sectional view of the semiconductor structure at a fifth-intermediate fabrication stage, according to an illustrative embodiment.

FIG. 5 is cross-sectional view illustrating the semiconductor structure 100 at a fifth intermediate stage of fabrication according to an exemplary embodiment. During this stage, ILD layer 118 in well/cavity 114 is first selectively removed using, for example, RIE or a wet etch, exposing a top surface of substrate 102.

Next, a portion of substrate 102 is recessed in well/cavity 114 using, for example, a dry or wet etching such as RIE. Liner layer 116 can also be removed in well/cavity 114 at the same time as recessing substrate 102 or in a subsequent step using a directional RIE. Etch stop layer 120 and sidewall liner 122 on etch stop layer 120 are removed using conventional techniques.

Figure 6:
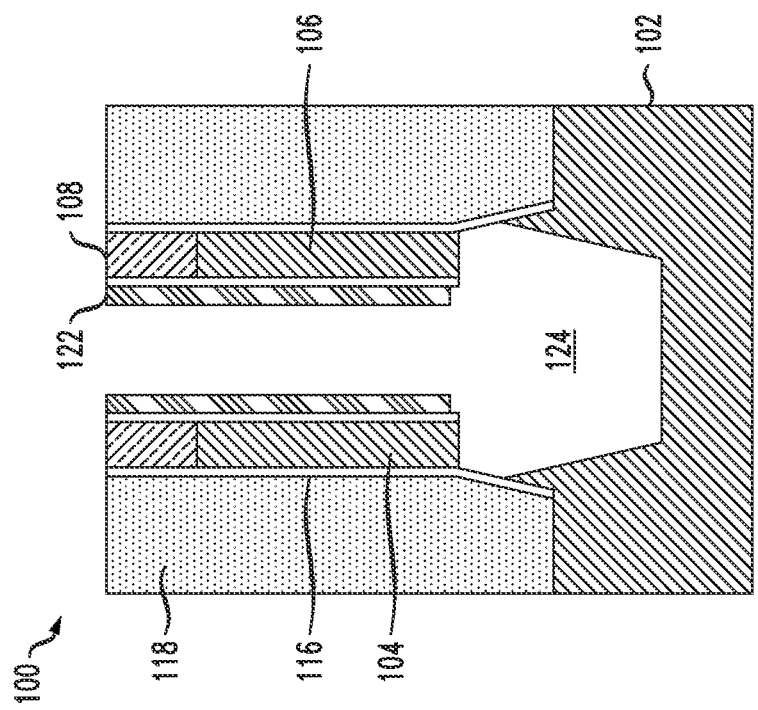
FIG. 6 is a cross-sectional view of the semiconductor structure at a sixth-intermediate fabrication stage, according to an illustrative embodiment.

FIG. 6 is cross-sectional view illustrating the semiconductor structure 100 at a sixth intermediate stage of fabrication according to an exemplary embodiment. During this stage, an isotropic etch, such as a wet chemical etch, is carried out to expand the well/cavity and form an expanded opening 124 exposing the bottom surface of fins 104 and 106, liner layer 116 and sidewall liner 122. The isotropic etch laterally etches pillars 110 and 112 to provide the opening having a sigma shape leaving a portion of pillars 110 and 112 on substrate 102 and the bottom portion of liner layer 116. The process of forming the sigma shape is such that the sigma corner regions extend beyond the fin edges. This can be achieved by performing, for example, an ammonium hydroxide wet etch, wherein the wet etch undercuts a portion of pillars 110 and 112.

FIG. 7 is cross-sectional view illustrating the semiconductor structure 100 at a seventh intermediate stage of fabrication according to an exemplary embodiment. During this stage, bottom source/drain region 126 is formed in expanded opening 124 and under the fins 104 and 106. The bottom source/drain region 126 can be formed by bottom-up epitaxial growth process. The epitaxially grown bottom source/drain region 126 can be in-situ doped, meaning dopants are incorporated into the epitaxy film during the epitaxy process. Other alternative doping techniques can be used, including but not limited to, for example, ion implantation, gas phase doping, plasma doping, plasma immersion ion implantation, cluster doping, infusion doping, liquid phase doping, solid phase doping, etc., and dopants may include, for example, an n-type dopant selected from a group of phosphorus (P), arsenic (As) and antimony (Sb), and a p-type dopant selected from a group of boron (B), gallium (Ga), indium (In), and thallium (Tl) at various concentrations. For example, in a non-limiting example, a dopant concentration range may be $1 \times 10^{18}/cm^3$ to $1 \times 10^{21}/cm^3$. According to an embodiment, the bottom source/drain region 126 can be a boron doped SiGe, or a phosphorous doped silicon.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RT-CVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 500° C. to 900° C. Although higher temperature typically results in faster deposition, the faster deposition may result in crystal defects and film cracking.

A number of different sources may be used for the epitaxial growth of the compressively strained layer. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, ldisilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

FIG. 8 is cross-sectional view illustrating the semiconductor structure 100 at an eighth intermediate stage of fabrication according to an exemplary embodiment. During this stage, sidewall liner 122 is selectively removed using, for example, a selective isotropic RIE or wet etch. Next, an ILD layer 128 is deposited on bottom source/drain region 126 and filling the opening between the fins 104 and 106 using conventional techniques such as CVD, ALD, PVD, PECVD, chemical solution deposition or other like processes. ILD layer 128 can be of the same material as described above for ILD layer 118. ILD layer 118 is then planarized by, for example, a planarization process such as CMP.

Figure 9:
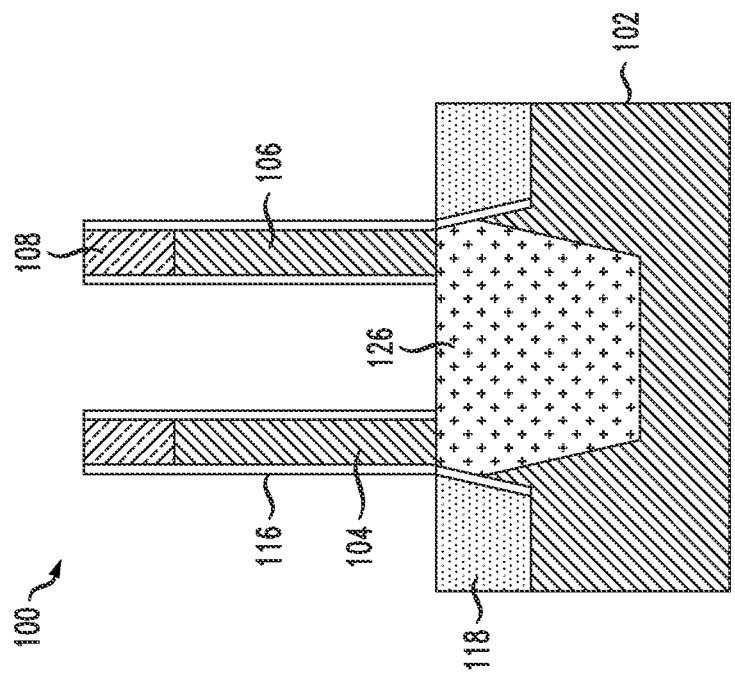
FIG. 9 is a cross-sectional view of the semiconductor structure at a ninth-intermediate fabrication stage, according to an illustrative embodiment.

FIG. 9 is cross-sectional view illustrating the semiconductor structure 100 at a ninth intermediate stage of fabrication according to an exemplary embodiment. During this stage, fins 104 and 106 are exposed by selectively removing ILD layer 118 and ILD layer 128 using, for example, a selective directional RIE to leaving a portion of ILD layer 118 on substrate 102.

Figure 10:
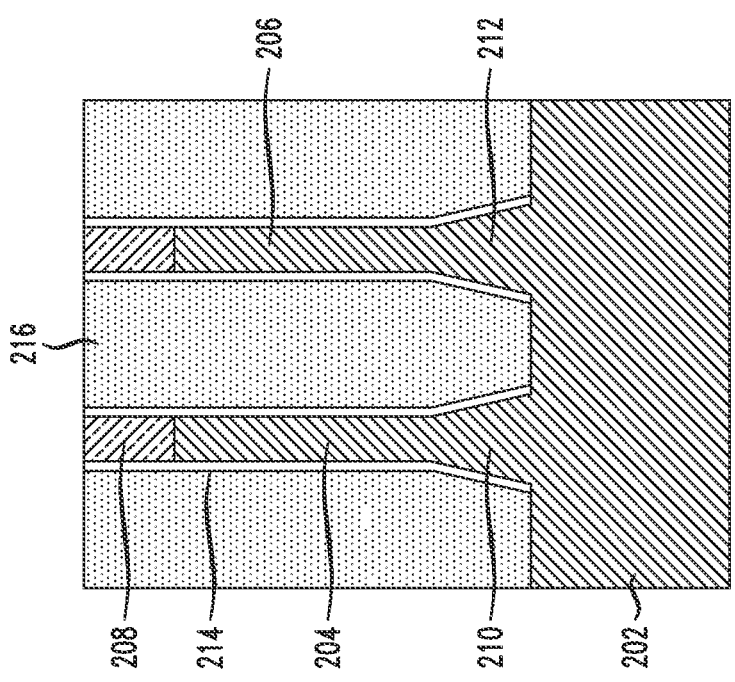
FIG. 10 is a cross-sectional view of the semiconductor structure at a first-intermediate fabrication stage, according to an illustrative alternative embodiment.

FIGS. 10-18 illustrate an alternate embodiment starting with semiconductor structure 200. Note that the same reference numeral (200) is used to denote the semiconductor structure through the various intermediate fabrication stages illustrated in FIGS. 10 through 18. First, as shown in FIG. 10, semiconductor structure 200 is shown comprising semiconductor substrate 202. FIG. 10 shows a partial semiconductor structure/device 200 including a semiconductor substrate 202, fins 204 and 206, and a hardmask layer 208. Semiconductor substrate 202 can be the semiconductor material as semiconductor substrate 102. Fins, such as fins 204 and 206, may be formed as described above such as by depositing hardmask layer 108 on the surface of semiconductor substrate 202 and patterning and etching.

The etching results in pillar structures 210 and 212 being formed from the substrate 102. In one embodiment, a bottom portion of each pillar structure is wider than a top portion of each pillar structure and the fin structure itself, i.e., wherein each pillar of the plurality of pillars is formed with a tapered configuration. The etching also results in a well/cavity (not shown) being formed between each pillar structure 210 and 212 and below the fin structures 204 and 206. In one embodiment, the fins have a thickness of, for example, about 20 nm to about 100 nm.

Next, a liner layer 214 is deposited on the exterior surfaces of fins 204 and 206 and pillars 210 and 212. The liner layer 214 can be deposited in the same manner as and can be of the same material as liner layer 116. An ILD layer 216 is deposited on substrate 202 and on liner layer 214. The ILD layer 216 can be deposited in the same manner and as and can be of the same material as ILD layer 118. ILD layer 216 is then planarized by, for example, a planarization process such as CMP.

FIG. 11 is cross-sectional view illustrating the semiconductor structure 200 at a second intermediate stage of fabrication according to an exemplary embodiment. During this stage, fins 204 and 206 are exposed by selectively removing ILD layer 216 to the top of pillars 210 and 212 using, for example, an RIE that is selective to ILD layer 216 over liner layer 214.

FIG. 12 is cross-sectional view illustrating the semiconductor structure 200 at a third intermediate stage of fabrication according to an exemplary embodiment. During this stage, liner layer 218 is formed on a top surface of ILD layer 216 and over the exterior surfaces of liner layer 214 and fins 204 and 206. Liner layer 218 may be formed by conformally depositing a layer of liner material. Suitable materials for sidewall liner 218 can those described above for sidewall liner 122. Next, a dielectric layer 220 is deposited on liner layer 218 and over fins 204 and 206 using a conventional deposition process including, for example, e.g., spin-coating, ALD, MLD, CVD, and PVD, among other known processes. Dielectric materials used to form the dielectric layer 220 include spin-on low-k dielectrics. Suitable dielectric materials include, for example, silicon oxide, silicon nitride, silicon oxynitride, SiOCN, SiBCN, SiCO, etc. Dielectric layer 220 can then be planarized by, for example, a planarization process such as CMP.

Figure 13:
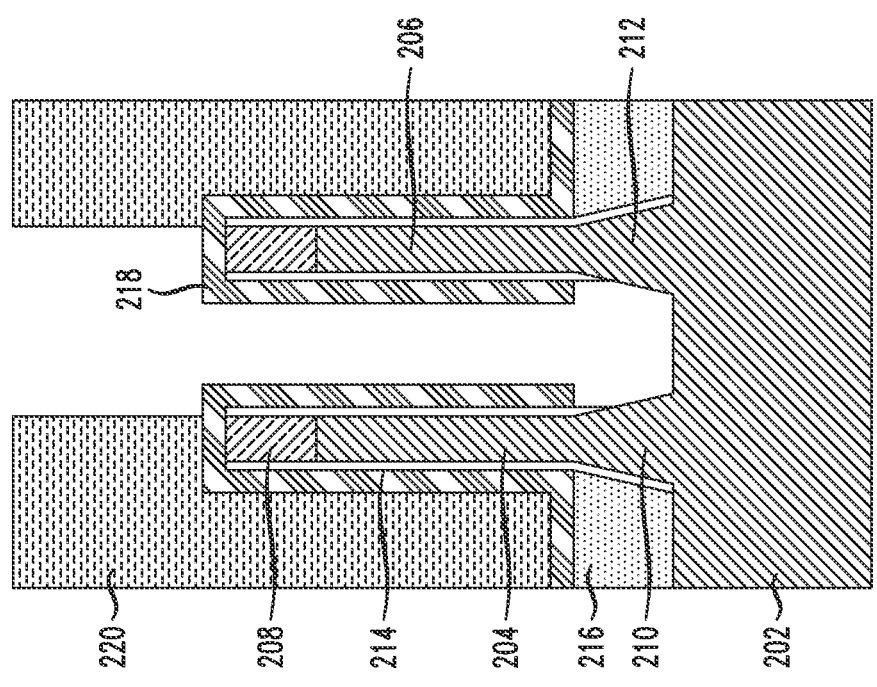
FIG. 13 is a cross-sectional view of the semiconductor structure at a fourth-intermediate fabrication stage, according to an illustrative alternative embodiment.

FIG. 13 is cross-sectional view illustrating the semiconductor structure 200 at a fourth intermediate stage of fabrication according to an exemplary embodiment. During this stage, a trench is formed between fins 204 and 206 by methods known in the art, e.g., lithography patterning followed by etching such as RIE that is selective to dielectric layer 220 over sidewall liner 218.

Figure 14:
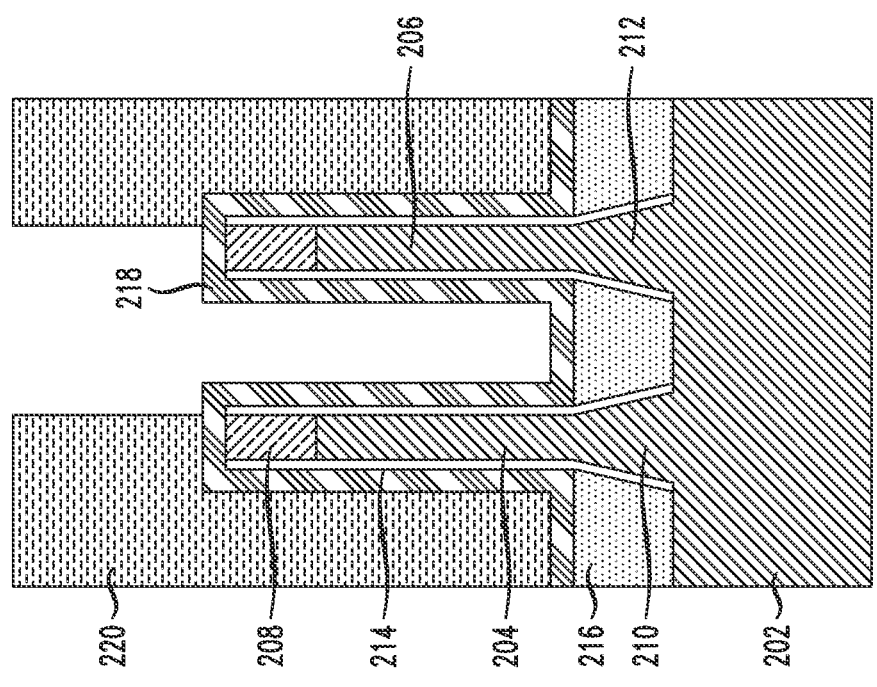
FIG. 14 is a cross-sectional view of the semiconductor structure at a fifth-intermediate fabrication stage, according to an illustrative alternative embodiment.

FIG. 14 is cross-sectional view illustrating the semiconductor structure 200 at a fifth intermediate stage of fabrication according to an exemplary embodiment. During this stage, a directional etching, such as an RIE, is performed to remove the planar portion of liner layer 218 in the trench exposing a top surface of ILD layer 216. The etch may comprise, for example, a fluorine based plasma etch as known in the art. Next, ILD 216 and liner layer 214 are removed using, for example, a dry or wet etching such as RIE, to form an opening between pillars 210 and 212 and exposing a top surface of substrate 202.

Figure 15:
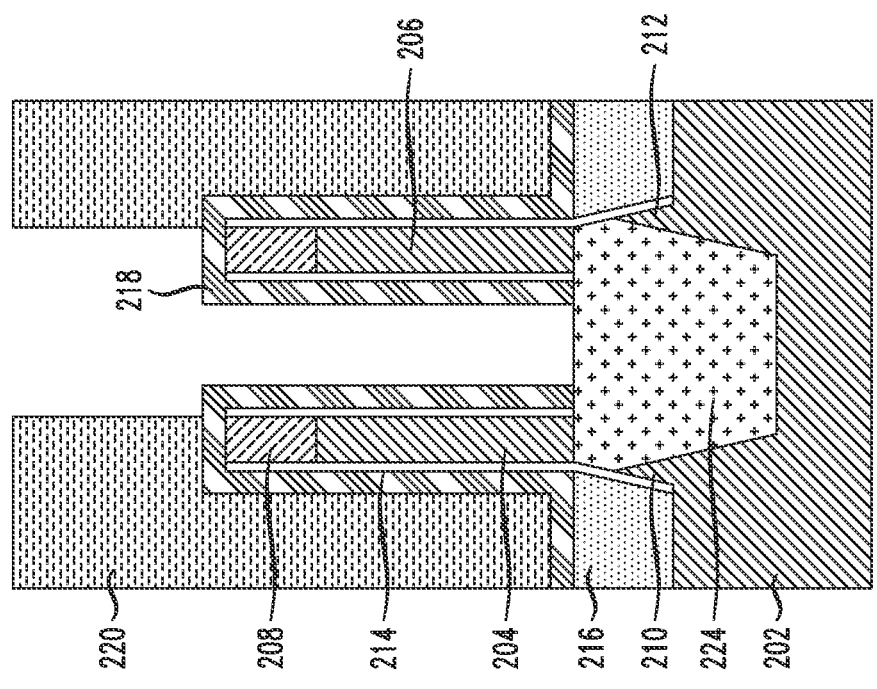
FIG. 15 is a cross-sectional view of the semiconductor structure at a sixth-intermediate fabrication stage, according to an illustrative alternative embodiment.

FIG. 15 is cross-sectional view illustrating the semiconductor structure 200 at a sixth intermediate stage of fabrication according to an exemplary embodiment. During this stage, a portion of substrate 202 is first recessed in the trench using, for example, a dry or wet etching such as RIE. Next, an isotropic etch, such as a wet chemical etch, is carried out to expand the opening and form an expanded opening 222 exposing the bottom surface of fins 204 and 206, liner layer 214 and liner layer 218. The isotropic etch laterally etches pillars 210 and 212 to provide the opening having a sigma shape leaving a portion of pillars 210 and 212 on substrate 202 and the bottom portion of liner layer 214. The process of forming the sigma shape is such that the sigma corner regions extend beyond the fin edges. This can be achieved by performing, for example, an ammonium hydroxide wet etch, wherein the wet etch undercuts a portion of pillars 210 and 212.

Figure 16:
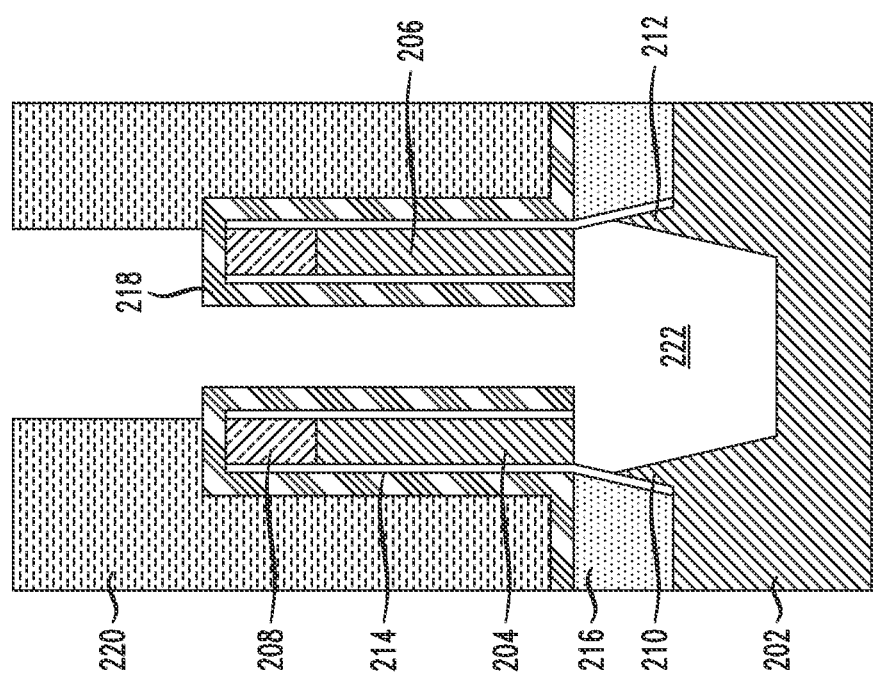
FIG. 16 is a cross-sectional view of the semiconductor structure at a seventh-intermediate fabrication stage, according to an illustrative alternative embodiment.

FIG. 16 is cross-sectional view illustrating the semiconductor structure 200 at a seventh intermediate stage of fabrication according to an exemplary embodiment. During this stage, bottom source/drain region 224 is formed in expanded opening 222 and under the fins 204 and 206. The bottom source/drain region 224 can be formed by bottom-up epitaxial growth process as discussed above for bottom source/drain region 126.

FIG. 17 is cross-sectional view illustrating the semiconductor structure 200 at an eighth intermediate stage of fabrication according to an exemplary embodiment. During this stage, dielectric layer 220 is selectively removed using, for example, a selective isotropic RIE FIG. 18 is cross-sectional view illustrating the semiconductor structure 200 at a ninth intermediate stage of fabrication according to an exemplary embodiment. During this stage, fins 204 and 206 are exposed by selectively removing liner layer 218 using, for example, an isotropic RIE or wet process.

Figure 19:
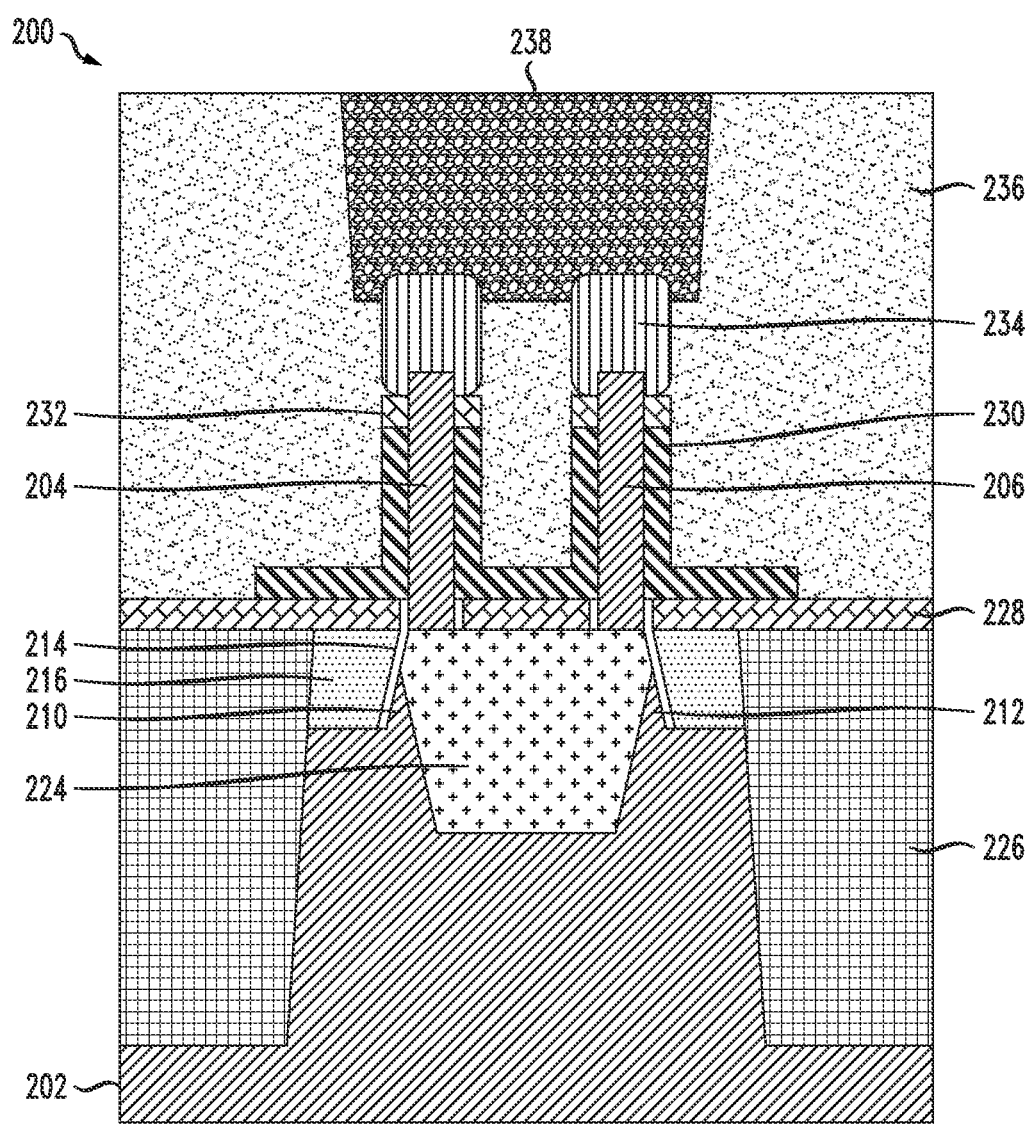
FIG. 19 is a cross-sectional view of a resulting semiconductor structure, according to an illustrative embodiment.

FIG. 19 is cross-sectional view illustrating a resulting semiconductor structure according to an exemplary embodiment. The resulting semiconductor structure can be obtained from either the semiconductor structure 100 of FIG. 9 or the semiconductor structure 200 of FIG. 18. For illustration purposes, the semiconductor structure of FIG. 19 will follow from semiconductor structure 200 of FIG. 18. During this stage, a shallow trench isolation (STI) region 226 is formed. For example, trenches can be formed down into the substrate 202. The substrate 202 is etched below a top surface of the substrate 202 and above a bottom surface of the substrate 202. STI oxide is then deposited within the trenches forming STI region 226.

A bottom spacer layer 228 is then formed in contact with each of the fins 204 and 206. The bottom spacer 228 includes a bottom surface in contact with the top surface of the STI region 226 and the top surface of ILD 216. The bottom spacer 228 also contacts sidewalls of fins 204 and 206. In one embodiment, bottom spacer 228 includes an insulating material (such as silicon oxide, silicon nitride, silicon oxynitride, or a combination of these) and is formed using any conventional deposition process such as, for example, CVD and subsequent etching techniques.

Next, a work function metal layer 230 is formed on a portion of bottom spacer 228 and on sidewalls of fins 204 and 206 employing, for example, CVD, sputtering, or plating. The work function metal layer 230 include one or more metals having a function suitable to tune the work function of nFETs or pFETs. Exemplary first metals that can be employed in the work function metal layer include, but are not limited to, La, Ti, and Ta. The thickness of the work function metal layers can be from about 3 nm to about 15 nm, although lesser and greater thicknesses can also be employed.

A top spacer layer 232 is then formed on work function metal layer 230. The top spacer layer 232 includes a bottom surface that contacts the top surface of work function metal layer 230, and a sidewall of the top spacer layer 232 contacts the portions of the sidewalls of the fins 204 and 206. In one embodiment, the top spacer layer 232 can be of the same or different material as the bottom spacer layer 228. For example, the top spacer layer 232 can include an insulating material such as silicon oxide, silicon nitride, silicon oxynitride, or a combination of these, and can be formed using any conventional deposition process such as, for example, CVD and subsequent etching techniques. The deposited spacer material is then subsequently etched to form the final spacer structure.

A top source/drain region 234 is then formed using an epitaxy process. The top source/drain region 234 is formed on and in contact with fins 204 and 206 and the top spacer layer 226. A bottom surface of the top source/drain region 234 contacts a top surface of fins 204 and 206 and a top surface of the top spacer layer 232. The top source/drain region 234 has a thickness in a range of, for example, about 10 nm to about 200 nm. However, other thicknesses are applicable as well. Top source/drain region 234 can be formed in a similar manner as discussed above for bottom source/drain region 224.

A layer of dielectric material 236 is then blanket deposited atop the entire structure 200. The deposited dielectric material 236 includes a top surface that is above a top surface of the top source/drain region 234. The blanket dielectric may be a silicon-based material, such as $SiO_2$, $Si_3N_4$, SiOxNy, SiC, SiCO, SiCOH, and SiCH compounds; the above-mentioned silicon-based materials with some or all of the Si replaced by Ge; carbon-doped oxides; inorganic oxides; inorganic polymers; hybrid polymers; organic polymers such as polyamides or SiLK™; other carbon-based materials; organo-inorganic materials such as spin-on glasses and silsesquioxane-based materials; and diamond-like carbon (DLC, also known as amorphous hydrogenated carbon, α-C:H). Additional choices for the blanket dielectric include any of the aforementioned materials in porous form, or in a form that changes during processing to or from being porous and/or permeable to being non-porous and/or non-permeable.

The deposited dielectric 236 is then patterned and etched to form a via/trench (not shown). Conductive material is then deposited to form a metal contact 238 within the trench. The metal contact 238 contacts the top surface of the exposed top source/drain region 234. Suitable conductive material includes, for example, aluminum (Al), chromium (Cr), hafnium (Hf), iridium (Ir), molybdenum (Mo), niobium (Nb), osmium (Os), rhenium (Re), rhodium (Rh), ruthenium (Ru), tantalum (Ta), titanium (Ti), tungsten (W), vanadium (V), zirconium (Zr), and alloys thereof.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:

1. A vertical field effect transistor structure, comprising:
   at least two vertically oriented fins extending from a substrate; and
   a first source/drain region disposed under and between two adjacent vertically oriented fins, the first source/drain region extending into the substrate;
   wherein the first source/drain region comprises a sigma-shaped configuration;
   wherein a top surface of the sigma-shaped configuration of the first source/drain region is in contact with respective lower ends of the vertically oriented fins;
   wherein a lateral portion of the sigma-shaped configuration of the first source/drain region extends beyond lateral sidewalls of the vertically oriented fins; and
   wherein a portion of the lateral portion of the sigma-shaped configuration of the first source/drain region extending beyond the lateral sidewalls of the vertically oriented fins is below outer ends of the first source/drain region.

2. The vertical field effect transistor structure according to claim 1, wherein the first source/drain region comprises an epitaxial grown first source/drain region.

3. The vertical field effect transistor structure according to claim 1, wherein the first source/drain region comprises a tapered configuration such that the top surface of the first source/drain region is wider than a bottom surface of the first source/drain region.

4. The vertical field effect transistor structure according to claim 1, further comprising a gate structure disposed on at least one of two vertically oriented fins.

5. The vertical field effect transistor structure according to claim 4, further comprising a second source/drain region disposed on the gate structure.

6. The vertical field effect transistor structure according to claim 1, further comprising:
   a spacer layer disposed on at least the top surface of the first source/drain region between the two adjacent vertically oriented fins;
   a plurality of gate structures respectively disposed on the spacer layer and the two adjacent vertically oriented fins;
   a plurality of second source/drain regions respectively disposed on the gate structures; and
   a source/drain contact disposed on at least one of the plurality of second source/drain regions.

7. The vertical field effect transistor structure according to claim 1, further comprising a liner layer disposed on the two adjacent vertically oriented fins and on a portion of the first source/drain region.

8. An integrated circuit, comprising:
   one or more vertical field effect transistor structures, wherein at least one of the vertical field effect transistor structures comprises:
      at least two vertically oriented fins extending from a substrate; and
      a first source/drain region disposed under and between two adjacent vertically oriented fins, the first source/drain region extending into the substrate;
      wherein the first source/drain region comprises a sigma-shaped configuration;
      wherein a top surface of the sigma-shaped configuration of the first source/drain region is in contact with respective lower ends of the vertically oriented fins;
      wherein a lateral portion of the sigma-shaped configuration of the first source/drain region extends beyond lateral sidewalls of the vertically oriented fins; and
      wherein a portion of the lateral portion of the sigma-shaped configuration of the first source/drain region extending beyond the lateral sidewalls of the vertically oriented fins is below outer ends of the first source/drain region.

9. The integrated circuit according to claim 8, wherein the first source/drain region comprises an epitaxial grown first source/drain region.

10. The integrated circuit according to claim 8, wherein the first source/drain region comprises a tapered configuration such that the top surface of the first source/drain region is wider than a bottom surface of the first source/drain region.

11. The integrated circuit according to claim 8, wherein the at least one of the vertical field effect transistor structures further comprises a gate structure disposed on at least one of two vertically oriented fins.

12. The integrated circuit according to claim 11, wherein the at least one of the vertical field effect transistor structure further comprises a second source/drain region disposed on the gate structure.

13. The integrated circuit according to claim 8, wherein the at least one of the vertical field effect transistor structures further comprises:
   a spacer layer disposed on at least the top surface of the first source/drain region between the two adjacent vertically oriented fins;
   a plurality of gate structures respectively disposed on the spacer layer and the two adjacent vertically oriented fins;
   a plurality of second source/drain regions respectively disposed on the gate structures; and
   a source/drain contact disposed on at least one of the plurality of second source/drain regions.

14. The integrated circuit according to claim 8, wherein the at least one of the vertical field effect transistor structures further comprises a liner layer disposed on the two adjacent vertically oriented fins and on a portion of the first source/drain region.

15. A semiconductor structure, comprising:
   a plurality of vertically oriented fins extending from a substrate;
   a first source/drain region disposed under and between two adjacent vertically oriented fins, the first source/drain region extending into the substrate, wherein the first source/drain region comprises a sigma-shaped configuration, wherein a top surface of the sigma-shaped configuration of the first source/drain region is in contact with respective lower ends of the adjacent vertically oriented fins, wherein a lateral portion of the sigma-shaped configuration of the first source/drain region extends beyond lateral sidewalls of the adjacent vertically oriented fins, and wherein a portion of the lateral portion of the sigma-shaped configuration of the first source/drain region extending beyond the lateral sidewalls of the vertically oriented fins is below outer ends of the first source/drain region;
   a first spacer layer disposed on at least a top surface of the first source/drain region between the adjacent vertically oriented fins;
   a plurality of gate structures respectively disposed on the first spacer layer and the adjacent vertically oriented fins;
   a second spacer layer disposed on at least a top surface of respective gate structures;
   a plurality of second source/drain regions respectively disposed on the second spacer layer; and a source/drain contact disposed on at least one of the plurality of second source/drain regions.

16. The semiconductor structure according to claim 15, wherein the first source/drain region comprises an epitaxial grown first source/drain region.

17. The semiconductor structure according to claim 15, wherein the first source/drain region comprises a boron doped SiGe, or a phosphorous doped silicon.

18. The semiconductor structure according to claim 15, wherein the first spacer layer and the second spacer layer independently comprise an insulating material.

19. The semiconductor structure according to claim 18, wherein the insulating material is one of silicon oxide, silicon nitride and silicon oxynitride.

20. The semiconductor structure according to claim 15, further comprising a liner layer disposed on the two adjacent vertically oriented fins and on a portion of the first source/drain region.

* * * * *